United States Patent
Dutta et al.

(10) Patent No.: US 8,004,900 B2
(45) Date of Patent: Aug. 23, 2011

(54) CONTROLLING SELECT GATE VOLTAGE DURING ERASE TO IMPROVE ENDURANCE IN NON-VOLATILE MEMORY

(75) Inventors: Deepanshu Dutta, Santa Clara, CA (US); Jeffrey W. Lutze, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 200 days.

(21) Appl. No.: 12/406,014

(22) Filed: Mar. 17, 2009

(65) Prior Publication Data

US 2010/0238730 A1  Sep. 23, 2010

(51) Int. Cl.
*G11C 11/34* (2006.01)
*G11C 16/04* (2006.01)

(52) U.S. Cl. ......... 365/185.19; 365/185.18; 365/185.17; 365/185.27; 365/185.26; 365/185.29

(58) Field of Classification Search ............. 365/185.05, 365/185.17, 185.18, 185.19, 185.23, 185.26, 365/185.27, 185.29
See application file for complete search history.

(56) References Cited

U.S. PATENT DOCUMENTS

| | | | |
|---|---|---|---|
| 6,160,737 A | 12/2000 | Hsu et al. | |
| 6,222,770 B1 | 4/2001 | Roohparvar | |
| 6,344,993 B1 | 2/2002 | Harari et al. | |
| 6,859,397 B2 | 2/2005 | Lutze et al. | |
| 6,917,542 B2 | 7/2005 | Chen et al. | |
| 7,263,000 B2 * | 8/2007 | Hazama et al. | 365/185.2 |
| 7,450,433 B2 | 11/2008 | Wan et al. | |
| 7,535,766 B2 * | 5/2009 | Ito | 365/185.22 |
| 2003/0007389 A1 | 1/2003 | Ohtani et al. | |
| 2003/0095439 A1 | 5/2003 | San et al. | |
| 2006/0140012 A1 | 6/2006 | Wan et al. | |
| 2006/0221708 A1 | 10/2006 | Higashitani et al. | |
| 2008/0037330 A1 | 2/2008 | Park et al. | |
| 2008/0137409 A1 | 6/2008 | Nakamura et al. | |
| 2008/0151644 A1 | 6/2008 | Park et al. | |
| 2008/0181020 A1 | 7/2008 | Yu et al. | |
| 2009/0010071 A1 | 1/2009 | Lee | |

* cited by examiner

*Primary Examiner* — Huan Hoang
*Assistant Examiner* — Kretelia Graham
(74) *Attorney, Agent, or Firm* — Vierra Magen Marcus & DeNiro LLP

(57) ABSTRACT

A technique for erasing a non-volatile memory applies a p-well voltage to a substrate and drives or floats select gate voltages to accurately control the select gate voltage to improve write-erase endurance. Source and drain side select gates of a NAND string are driven at levels to optimize endurance. In one approach, the select gates float after being driven at a specific initial level, to reach a specific, optimal final level. In another approach, the select gates are driven at specific levels throughout an erase operation, in concert with the p-well voltage. In another approach, onset of select gate floating is delayed while the p-well voltage ramps up. In another approach, p-well voltage is ramped up in two steps, and the select gates are not floated until the second ramp begins. Floating can be achieved by raising the drive voltage to cut off pass gates of the select gates.

17 Claims, 9 Drawing Sheets

Fig. 8
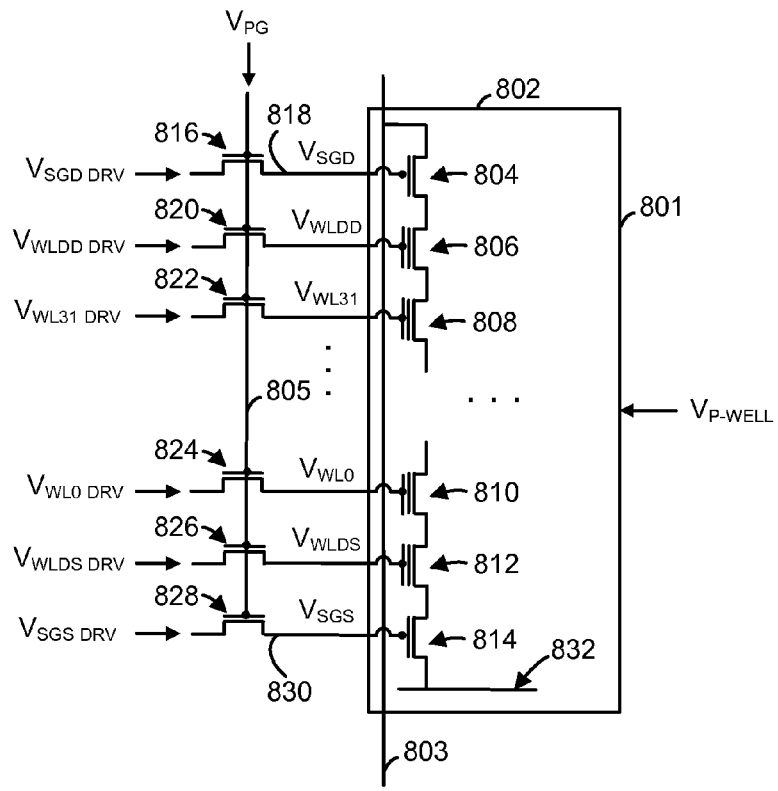
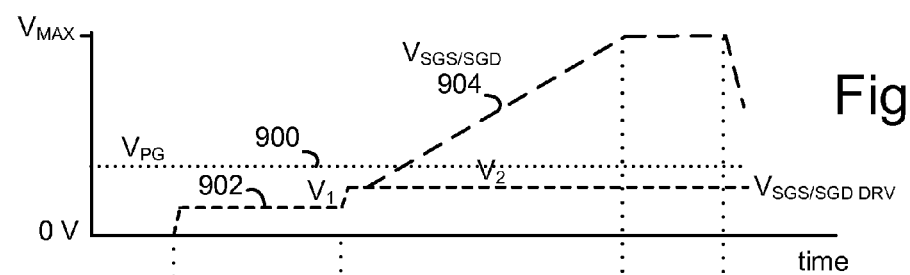
Fig. 9a
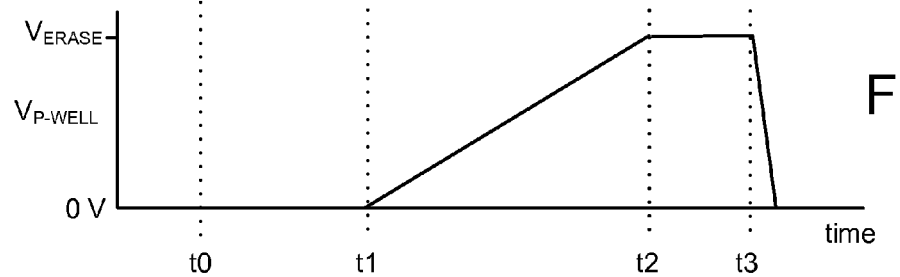
Fig. 9b

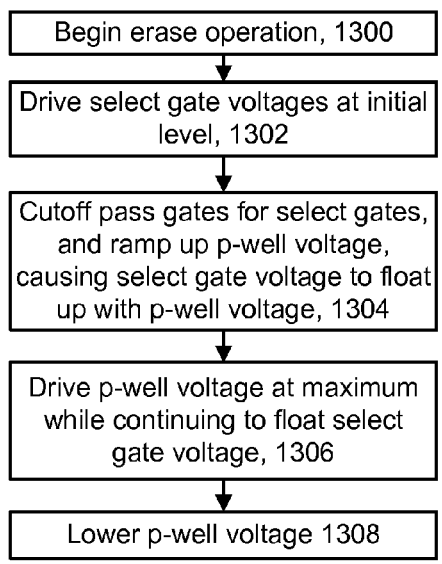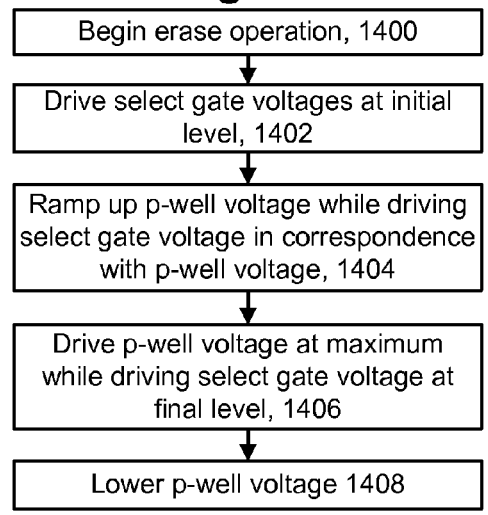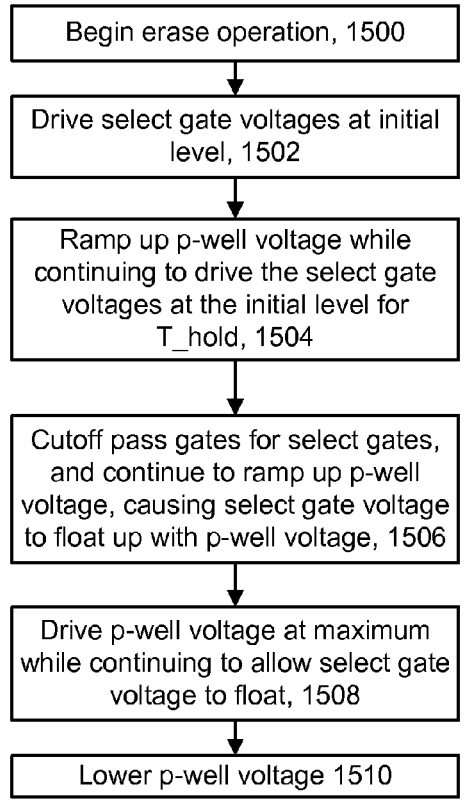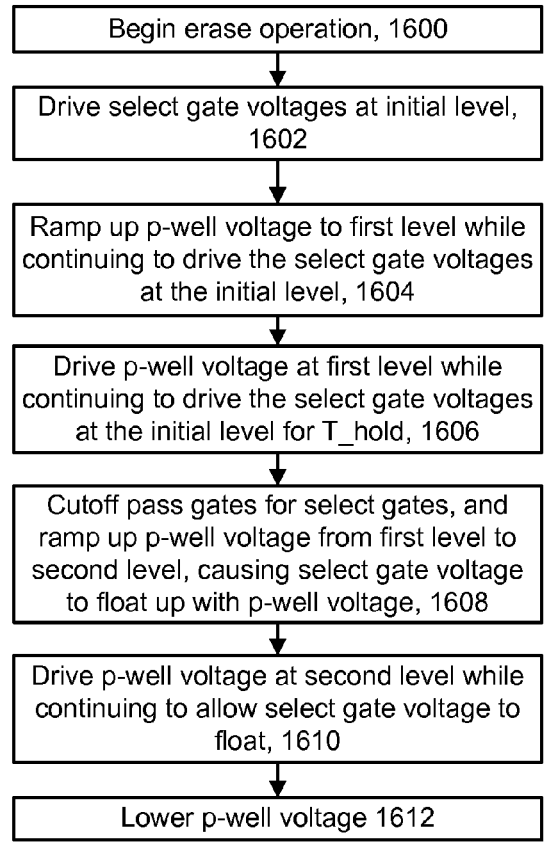

CONTROLLING SELECT GATE VOLTAGE DURING ERASE TO IMPROVE ENDURANCE IN NON-VOLATILE MEMORY

BACKGROUND OF THE INVENTION

1. Field of the Invention

The present invention relates to technology for non-volatile memory.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Self-Boosting Technique," and in U.S. Pat. No. 6,917,542, titled "Detecting Over Programmed Memory," both of which are incorporated herein by reference in their entirety.

Some EEPROM and flash memory devices have a floating gate that is used to store two ranges of charges and, therefore, the memory cell can be programmed/erased between two states (an erased state and a programmed state). Such a flash memory device is sometimes referred to as a binary flash memory device.

A multi-state flash memory device is implemented by identifying multiple distinct allowed/valid programmed threshold voltage ranges separated by forbidden ranges. Each distinct threshold voltage range corresponds to a predetermined value for the set of data bits encoded in the memory device.

However, techniques are need for improving the endurance of non-volatile memory devices.

SUMMARY OF THE INVENTION

Technology is described herein for improving endurance of non-volatile memory devices.

In one embodiment, a method is provided for erasing a set of non-volatile storage elements which is formed on a substrate. The set of non-volatile storage elements comprises one or more sets of series-connected non-volatile storage elements, and each set of series-connected non-volatile storage elements is arranged between respective select gates. The method includes, in a first time period, ramping up an erase voltage which is applied to the substrate from an initial level to a first level, and ramping up a driven voltage of at least one of the respective select gates from a starting level to a higher level in correspondence with the ramping up of the erase voltage. The method further includes, in a second time period which follows the first time period, driving the erase voltage at the first level while driving the voltage of the at least one of the respective select gates at the higher level.

In another embodiment, a method is provided for erasing a set of non-volatile storage elements which is formed on a substrate. The set of non-volatile storage elements comprises one or more sets of series-connected non-volatile storage elements, and each set of series-connected non-volatile storage elements is arranged between respective select gates. The method includes: (a) in a first time period, driving at least one of the respective select gates at a first, non-zero level, (b) in a second time period which follows the first time period, ramping up an erase voltage which is applied to the substrate while continuing to drive the at least one of the respective select gates at the first, non-zero level, (c) in a third time period which follows the second time period, continuing to ramp up the erase voltage, until the erase voltage reaches a first level, while floating a voltage of a control gate of the at least one of the respective select gates, and (d) in a fourth time period which follows the third time period, driving the erase voltage at the first level while continuing to float the voltage of the control gate.

In another embodiment, a method is provided for erasing a set of non-volatile storage elements which is formed on a substrate. The set of non-volatile storage elements comprises one or more sets of series-connected non-volatile storage elements, and each set of series-connected non-volatile storage elements is arranged between respective select gates. The method includes: (a) in a first time period, ramping up an erase voltage which is applied to the substrate from an initial level to a first level, and (b) in a second time period which follows the first time period, driving the erase voltage at the first level. The method further includes driving at least one of the respective select gates during the first and second time periods. The method further includes: (c) in a third time period which follows the second time period, ramping up the erase voltage further to a second level, while floating a voltage of a control gate of the at least one of the respective select gates, and (d) in a fourth time period which follows the third time period, driving the erase voltage at the second level, while continuing to float the voltage of the control gate of the at least one of the respective select gates.

In another embodiment, a non-volatile storage includes a set of non-volatile storage elements which is formed on a substrate and one or more control circuits. The set of non-volatile storage elements comprises one or more sets of series-connected non-volatile storage elements, and each set of series-connected non-volatile storage elements is arranged between respective select gates. The one or more control circuits, in a first time period, ramps up an erase voltage which is applied to the substrate from an initial level to a first level, and ramps up a driven voltage of at least one of the respective select gates from a starting level to a higher level in correspondence with the ramping up of the erase voltage. The one or more control circuits, in a second time period which follows the first time period, drive the erase voltage at the first level while driving the voltage of the at least one of the respective select gates at the higher level.

Corresponding methods, systems and computer- or processor-readable storage devices which have executable code for performing the methods provided herein may also be provided.

BRIEF DESCRIPTION OF THE DRAWINGS

FIG. 8 depicts voltages applied to a NAND string via pass gates.

FIG. 9a depicts select gate and control voltages vs. time during a first erase operation.

FIG. 9b depicts a p-well voltage vs. time during the first erase operation.

FIG. 13 depicts an erase process which corresponds to FIGS. 9a and 9b.

FIG. 14 depicts an erase process which corresponds to FIGS. 10a and 10b.

FIG. 15 depicts an erase process which corresponds to FIGS. 11a and 11b.

FIG. 16 depicts an erase process which corresponds to FIGS. 12a and 12b.

DETAILED DESCRIPTION

Figure 1A:
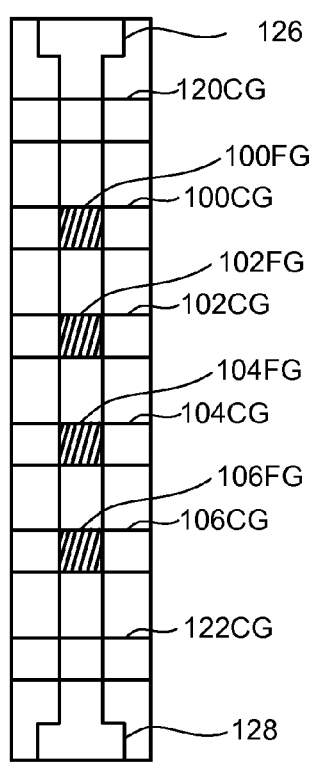
FIG. 1a is a top view of a NAND string.
Figure 1B:
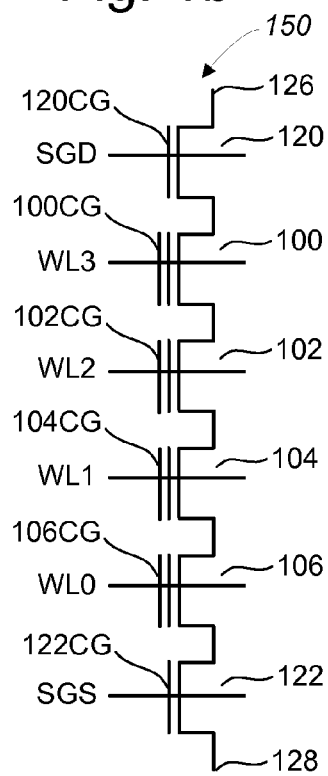
FIG. 1b is an equivalent circuit diagram of the NAND string.

One example of a memory system suitable for implementing the present invention uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted in FIGS. 1a and 1b includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 1C:
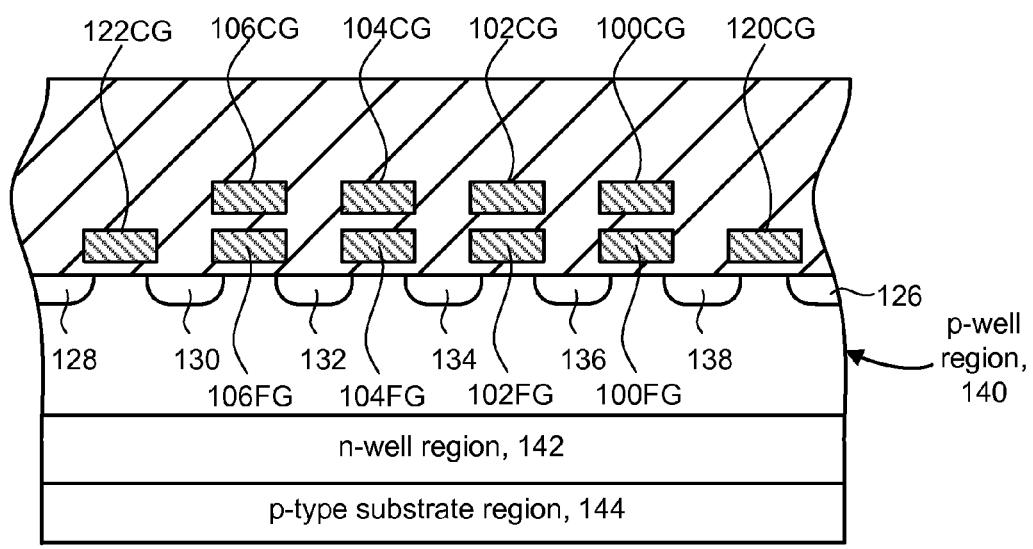
FIG. 1c is a cross-sectional view of the NAND string.

FIG. 1c provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1a-1c show four memory cells in the NAND string, the use of four transistors is provided only as an example. A NAND string used with the technology described herein can have less than four memory cells or more than four memory cells. For example, some NAND strings will include 8, 16, 32 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states)

are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present invention.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 2:
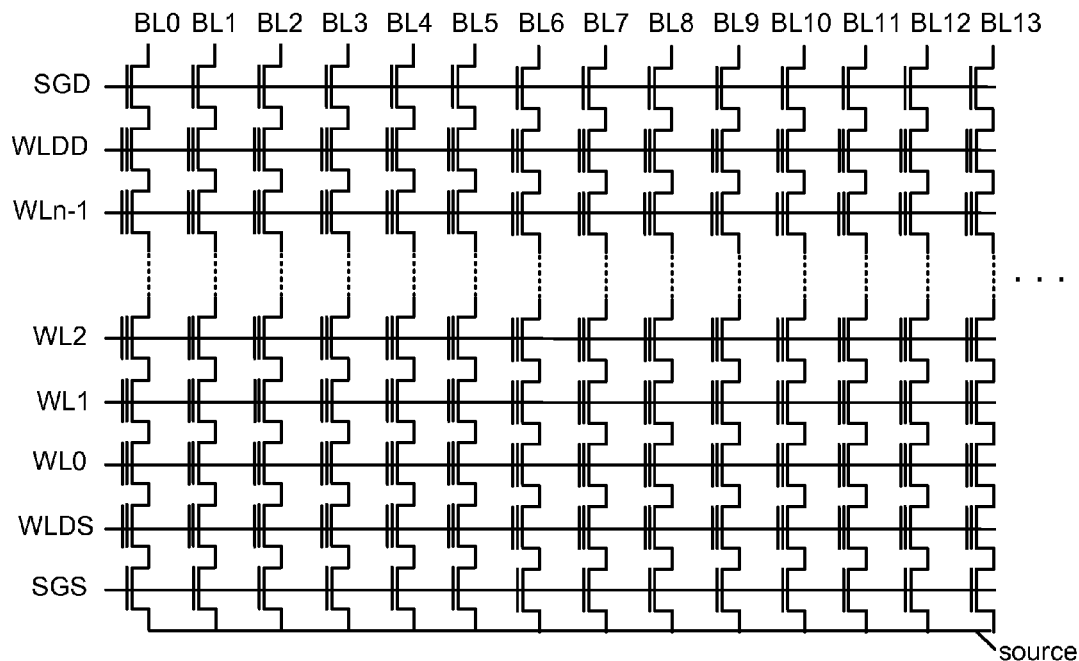
FIG. 2 depicts a block of NAND flash memory cells.

FIG. 2 depicts a block of NAND flash memory cells. The block includes a number of NAND strings and respective bit lines, e.g., BL0, BL1, . . . Each NAND string is connected at one end to a drain select gate (SGD), and the control gates of the drain select gates are connected via a common SGD line. The NAND strings are connected at their other end to a source select gate which, in turn, is connected to a common source line. A number n of word lines, including optional dummy word lines, extend between the source select gates and the drain select gates. Optionally, dummy word lines, which are associated with storage elements which do not store user data, are also provided. For example, a source side dummy word line WLDS is adjacent to the source select gate line SGS, and a drain side dummy word line WLDD is adjacent to the drain select gate line SGD. Dummy word lines help isolate the end word lines which are associated with storage elements which do store user data (e.g., non-dummy or user data word lines) from high voltages which are applied to the select gates.

Figure 3A:
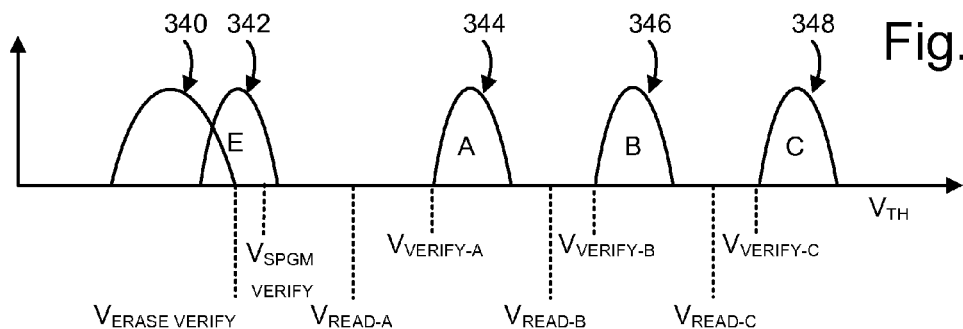
FIG. 3a depicts an example set of threshold voltage distributions.

FIG. 3a depicts threshold voltage distributions of an erased state and higher data states. The x-axis indicates a threshold voltage and the y-axis indicates a number of storage elements. In this example, there are four data states: an erased (E) state 342, an A state 344, a B state 346 and a C state 348. Memory devices with additional data states, e.g., eight or sixteen data states, or fewer states, e.g., two states, can also be used. An erase sequence can include an erase operation and an optional soft programming operation. The distribution 340 is realized after the erase operation when storage elements are typically over-erased, past the erase state 342. In the erase operation, one or more erase pulses are applied to the substrate until the threshold voltage of the storage elements being erased transitions below an erase verify level, $V_{ERASE-VERIFY}$. Each erase pulse can be followed by a verify pulse (See FIG. 3b). Once the erase operation is completed, the soft programming operation is performed, in which a number of positive voltage pulses are applied to the control gates of the storage elements, such as via a word line, to increase the threshold voltages of some or all of the storage elements in the distribution 340 closer to and below a soft programming verify level, $V_{SPGM-VERIFY}$, to the erased state 342. $V_{SPGM-VERIFY}$ is typically above or equal to $V_{ERASE-VERIFY}$. The soft programming operation advantageously results in a narrow erase state distribution 342. Once the soft programming operation is complete, programming to higher data states can occur, such as to states A, B and C using verify levels $V_{VERIFY-A}$, $V_{VERIFY-B}$ and $V_{VERIFY-C}$, respectively. A subsequent read operation can use the levels $V_{READ-A}$, $V_{READ-B}$ and $V_{READ-C}$.

Figure 3B:
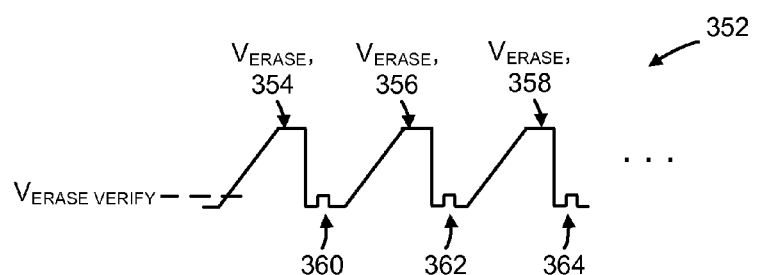
FIG. 3b depicts a sequence of erase waveforms.

FIG. 3b depicts a sequence of erase waveforms. As mentioned, an erase operation may involve applying a series of erase pulses/waveforms to the p-well of a memory device. Here a sequence 352 includes example erase pulses 354, 356 and 358, and erase verify pulses 360, 362 and 364. In another possible erase operation, a single continuous erase waveform is applied. In these and other possible erase operations, the select gate voltages may be controlled in concert with the erase pulses.

Figure 4:
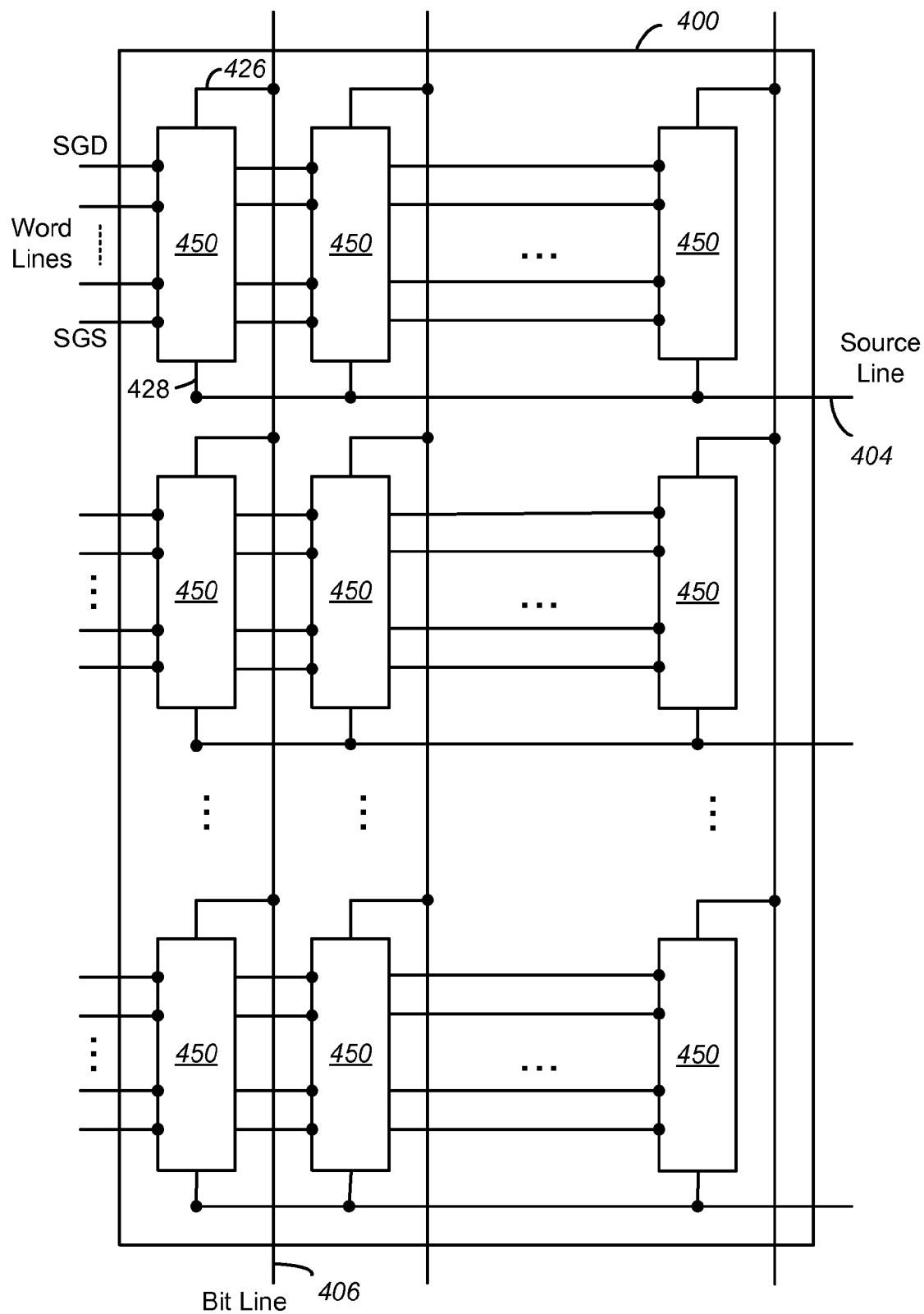
FIG. 4 is a block diagram of an array of NAND flash memory cells.

FIG. 4 illustrates an example of an array 400 of NAND cells, such as those shown in FIGS. 1a-1c. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in one embodiment by raising the p-well to an erase voltage (e.g., 20 volts) for a sufficient period of time and grounding or applying a low bias, e.g., 1 V, on the word lines of a selected block while the source and bit lines are floating. For example, we may apply ~1 V on WLDD and WLDS during erase, while all other word lines are at 0 V. Due to capacitive coupling, the unselected word lines, bit lines, select lines, and c-source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
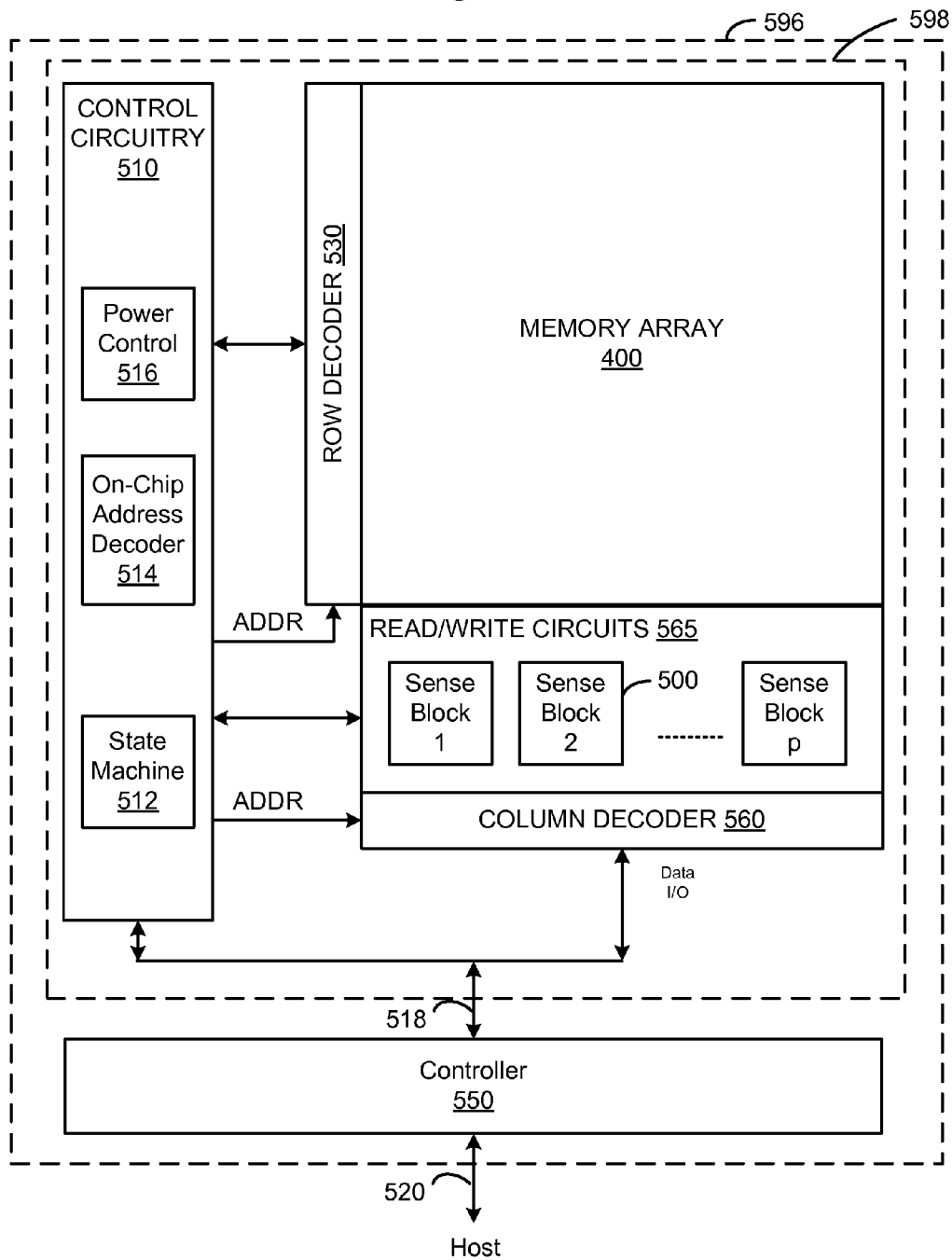
FIG. 5 is a block diagram of a non-volatile memory system.

FIG. 5 illustrates a memory device 596 having read/write circuits for reading and programming a page of memory cells in parallel, according to one embodiment of the present invention. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations.

In another approach, dual row/column decoders and read/write circuits are used. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
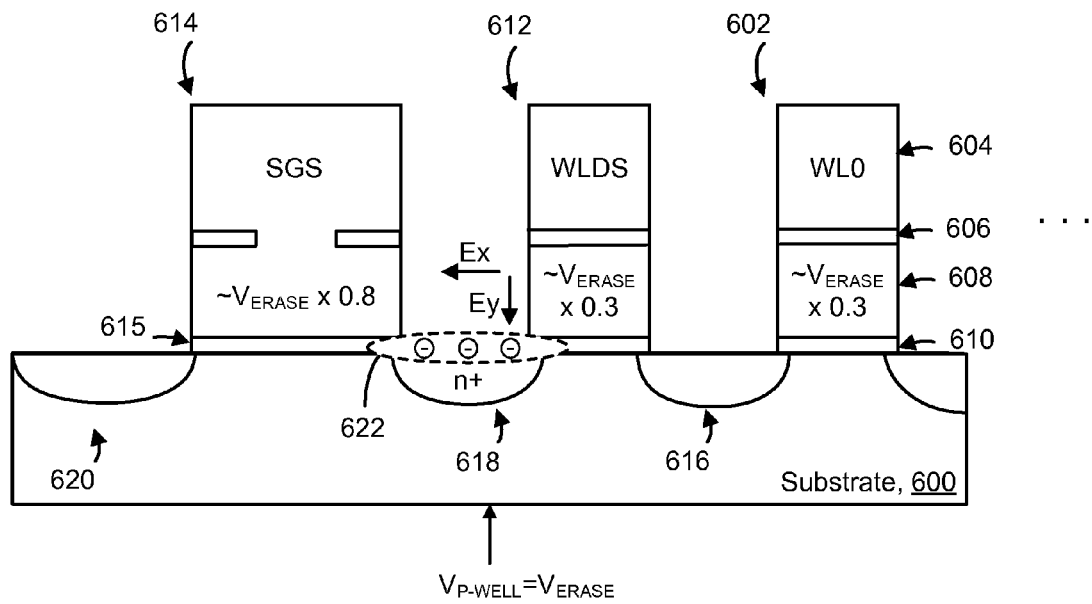
FIG. 6 is a cross section of a portion of a NAND string showing accumulation of electrons between a select gate and an adjacent storage element.

FIG. 6 is a cross section of a portion of a NAND string showing accumulation of electrons between a select gate and an adjacent storage element. The source end of the NAND string is depicted, including a storage element 602 which is associated with WL0, a storage element 612 which is associated with WLDS, and a source select gate (SGS) 614 which is associated with a respective control line. The components are formed on a substrate 600. The example storage element 602 includes a gate oxide 610, floating gate 608, interlayer dielectric 606 and a control gate 604 which is a portion of a word line which extends across multiple storage elements. The select gate 614 includes a gate oxide 615. Active regions include source/drain regions 616 and 618 and a region 620 at a drain side of the SGS 614. These regions are typically doped so that they can conduct a current.

As mentioned at the outset, techniques are needed for improving the endurance of non-volatile memory devices. In particular, write-erase (W/E) endurance generally refers to the ability of a memory device to withstand repeated write and erase cycles which occur over time, without degrading unacceptably. In particular, due to scaling to ever-smaller dimensions in memory devices, the edge word lines of a block, which can be dummy or non-dummy word lines or user data word lines, can limit W/E endurance. Most of the degradation on such edge word lines occurs during erase operations, when the p-well receives a relatively high positive voltage, $V_{P\text{-}WELL}=V_{ERASE}$, such as 20 V or more. Typically, the select gates are floated so that their voltage is coupled higher as well in concert with $V_{ERASE}$. This causes the select gates to reach a high voltage which is close to $V_{ERASE}$, such as $V_{ERASE} \times 0.8$, where a coupling factor of 80% is assumed. On the other hand, since the storage elements have a control gate that is biased instead of floating, in addition to a floating gate, they are typically coupled to a lesser degree, such as $V_{ERASE} \times 0.3$, where a coupling factor of 30% is assumed. As a result, a horizontal electric field (Ex) is generated which extends from the edge word line (e.g., WLDS on the source side of the NAND string) to the select gate (e.g., SGS), and which can help electrons to carry over to a space 622 between the edge word line and the select gate, where they accumulate. The same effect occurs on the drain side, where electrons can accumulate between the edge word line on the drain side and the drain select gate (SGD). Along with the horizontal field (Ex), a vertical field Ey also exists during the erase operation due to $V_{ERASE}$ on the p-well.

The accumulation of electrons in the region 622 over time causes the channel under the region to deplete. This drops the NAND chain current in the string, causing the threshold voltage of the edge word line to appear higher. As a result, the storage elements associated with the edge word lines are harder to erase, which in turn reduces the W/E endurance of the block.

The magnitude of the horizontal field (Ex) is a function of the difference between the voltages on the select gate and the storage element of the adjacent end word line.

Figure 7:
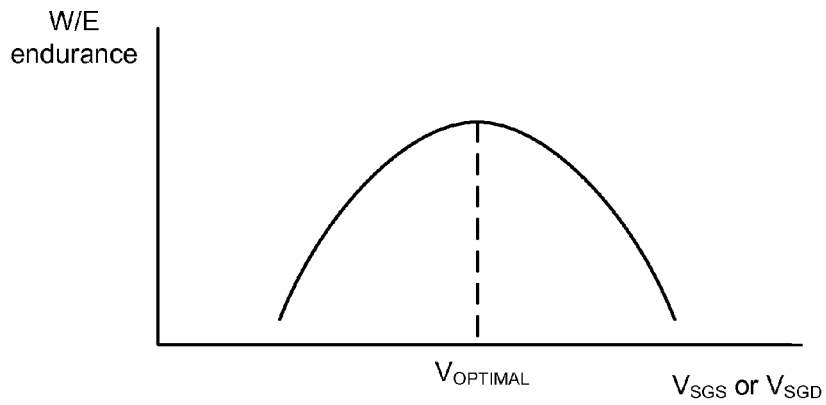
FIG. 7 depicts a write-erase endurance of a memory device for different values of select gate voltage.

FIG. 7 depicts a write-erase endurance of a memory device for different values of select gate voltage. To improve the edge word line degradation, the magnitude of the horizontal field (Ex) should be reduced. Controlling the select gate voltage $V_{SGS}$ or $V_{SGD}$ to a lower value during an erase operation can help improve endurance. Specifically, a higher select gate voltage makes the degradation worse. This indicates that the select gate voltage should be lowered. However, a lower select gate voltage can cause reliability issues by placing excessive stress on the gate oxide 615, since this stress is in proportion to the different between $V_{ERASE}$ and the select gate voltage. By controlling the select gate voltage appropriately so that it is at or near an optimal level, $V_{OPTIMAL}$, we can optimize endurance. This represents an optimal trade off between minimizing edge word line-related degradation and minimizing gate oxide stress, so that the gate oxide reliability is maintained. In practice, $V_{OPTIMAL}$ can be determined for a particular memory device from experimentation and/or theoretical calculations.

For example, the optimal erase value can be trimmed for each memory die at the time of manufacture. Testing may reduce the endurance of the tested memory devices, so these devices may have to be sacrificed to determine optimal levels which can be configured into other devices via firmware, for instance.

Additional measures can be taken as well, such as applying a small voltage, e.g., 0-2 V on the edge word lines during the erase operation to reduce the erase stress on the gate oxides of the associated storage elements, or raising $V_{SGS}$ or $V_{SGD}$ to a certain level, such as a supply voltage level $V_{DD}$, before the selects gates are floated during the erase operation.

FIG. 8 depicts voltages applied to a NAND string via pass gates. A portion of an example NAND string in a block 801 is shown with associated driving voltages. The NAND string includes a drain select gate 804, drain side dummy storage element 806 on WLDD, user data storage element 808 on WL31, ..., user data storage element 810 on WL0, source side dummy storage element 812 on WLDS, and select gate 814. The NAND string is connected at the drain end to a bit line 803, and at the source end to a source lines 832. A word line or control line is in communication with each select gate or storage element. Moreover, a voltage is driven on each word line or control line via a respective pass gate which is controlled by a voltage $V_{PG}$ from a block decoder (not shown) of the block 801, in one possible implementation. $V_{PG}$ is provided to the control gates of each pass gate via a common line 805.

Specifically, drive voltages can be applied as follows: $V_{SGD\_DRV}$ to drain select gate 804 via pass gate 816 and line 818, $V_{WLDD\_DRV}$ to storage element 806 via pass gate 820, $V_{WL31\_DRV}$ to storage element 808 via pass gate 822, ..., $V_{WL0\_DRV}$ to storage element 810 via pass gate 824, $V_{WLDS\_DRV}$ to storage element 812 via pass gate 826, and $V_{SGS\_DRV}$ to source select gate 814 via pass gate 828 and line 830. Note that each line is not necessarily driven at all times. For example, the word lines are typically driven to a low voltage and select gate lines can be driven or floated as discussed in further detail below. The p-well erase voltage $V_{P\text{-}WELL}$ is applied to the substrate on which the block 801 is formed.

FIG. 9a depicts select gate and control voltages vs. time during a first erase operation. The x-axis denotes time and the y-axis denotes voltage. In one approach, $V_{SGS}$ and $V_{SGD}$ are driven equally. However, it is also possible to drive them at different levels, such as if they had different physical characteristics.

At a start of the erase operation, at t0, the pass gate voltage $V_{PG}$ (waveform 900) is set to a level which is high enough to allow the drive voltage $V_{SGS/SGD\_DRV}$ (referring to either $V_{SGD\_DRV}$ or $V_{SGS\_DRV}$) to pass to the respective select gate. Typically, this level exceeds the sum of the drive voltage and the threshold voltage of the pass gate. Thus, the pass gates 816 and 828 (FIG. 8) will be in an on or conductive state. Between t0 and t1, $V_{SGS/SGD\_DRV}$ is set to an initial level, $V_1$ (waveform 902) so that $V_{SGS/SGD}$ (referring to either $V_{SGD}$ or $V_{SGS}$) is also set to this level. At t1, the p-well voltage, $V_{P\text{-}WELL}$, begins to ramp up, as depicted in FIG. 9b, and $V_{SGS/SGD}$ is allowed to float up in concert with $V_{P\text{-}WELL}$, as indicated by the dashed lines 904. Floating of $V_{SGS/SGD}$ can be achieved starting at t1 by cutting off the pass gates 816 and 828 by raising $V_{SGS/SGD\_DRV}$ so that the $V_{PG}$ no longer exceeds the sum of $V_{SGS/SGD\_DRV}$ and the threshold voltage of the pass gate. With the select gate pass gates cutoff, $V_{SGS/SGD}$ no longer equals $V_{SGS/SGD\_DRV}$. $V_{SGS/SGD\_DRV}$ can be set to $V_2$, which is above $V_1$ after t1, in one approach.

FIG. 9b depicts a p-well voltage vs. time during the first erase operation. Between t1 and t2, $V_{P\text{-}WELL}$ is ramped up from a starting level such as 0 V. At t2, $V_{P\text{-}WELL}$ reaches its final level, $V_{ERASE}$, and is held there until t3. Due to a coupling ratio R between the p-well and the select gate, $V_{SGS/SGD}$ floats to a level $V_{MAX}=V_2+V_{ERASE}\times R$. In this approach, $V_{SGS/SGD}$ cannot be lowered below $V_{ERASE}\times R$ and, instead, can only be controlled in a high voltage range. Hence, we do not have complete control over $V_{SGS/SGD}$. This makes it harder to reach the optimum voltage $V_{OPTIMAL}$ at which W/E endurance is maximized. Generally, it is desirable to have a good control over $V_{SGS/SGD}$ during the erase operation.

However, if $V_{ERASE}\times R<V_{OPTIMAL}$, we can set $V_2$ to a specified level such as $V_{OPTIMAL}-V_{ERASE}\times R$ to control the final level of $V_{SGS/SGD}$. We take advantage of the known amount of coupling and the known final optimal level of $V_{SGS/SGD}$ to set the corresponding optimal initial level. This is in contrast to setting the initial level to 0 V or to a default power supply level ($V_{DD}$) or read pass level ($V_{READ}$), which does not achieve a specified desired final level to be reached by $V_{SGS/SGD}$.

Note that using coupling to raise $V_{SGS/SGD}$ can be beneficial in that it self-balances the select gate oxide. In contrast, driving the select gates throughout the erase operation could cause the optimal level to move over time. Driving the select gates also increases power consumption versus floating the select gates. Also, depending on the capabilities of the select gate drivers, they may not output a sufficiently high voltage to drive the select gates at a desired level, in which case coupling is preferable.

Figure 10A:
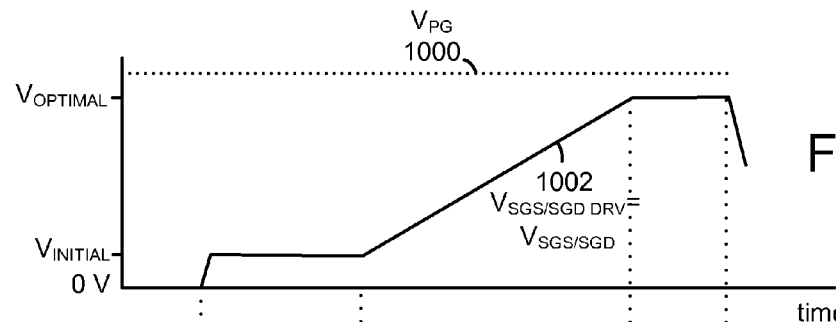
FIG. 10a depicts select gate and control voltages vs. time during a second erase operation.
Figure 10B:
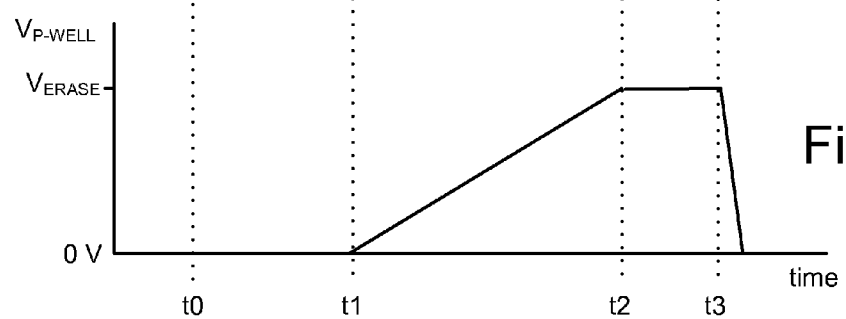
FIG. 10b depicts a p-well voltage vs. time during the second erase operation.

FIG. 10a depicts select gate and control voltages vs. time during a second erase operation. In this approach, $V_{SGS/SGD}$ is driven (and not floated) at all times during the erase operation, as indicated by waveform 1002. Specifically, at a start of the erase operation, at t0, $V_{SGS/SGD}$ is raised to an initial level $V_{INITIAL}$ by setting the corresponding drivers $V_{SGS/SGD\_DRV}$ at this level and setting $V_{PG}$ sufficiently high (waveform 1000). At t1, $V_{P\text{-}WELL}$ begins to ramp up, as depicted in FIG. 10b, and $V_{SGS/SGD}$ is driven in correspondence with $V_{P\text{-}WELL}$. $V_{PG}$ is kept high to maintain the pass gates in a conductive state. FIG. 10b depicts a p-well voltage vs. time during the second erase operation. Between t1 and t2, $V_{P\text{-}WELL}$ is ramped up. At t2, $V_{P\text{-}WELL}$ reaches its final level, $V_{ERASE}$, and is held there until t3. Also between t2 and t3, $V_{SGS/SGD}$ is driven at a final level such as $V_{OPTIMAL}$. Here, there is no concern with the coupling ratio between the p-well and the select gates because $V_{SGS/SGD}$ is driven to the desired final level. Note that, between t1–t2, driving $V_{SGS/SGD}$ in correspondence with $V_{P\text{-}WELL}$ maintains a relatively constant gate oxide stress on the select gates, since this stress is a function of the difference between these ramped voltages. Furthermore, $V_{INITIAL}$ can be set as desired at an optimal level. This approach provides complete control over the relevant voltages.

Figure 11A:
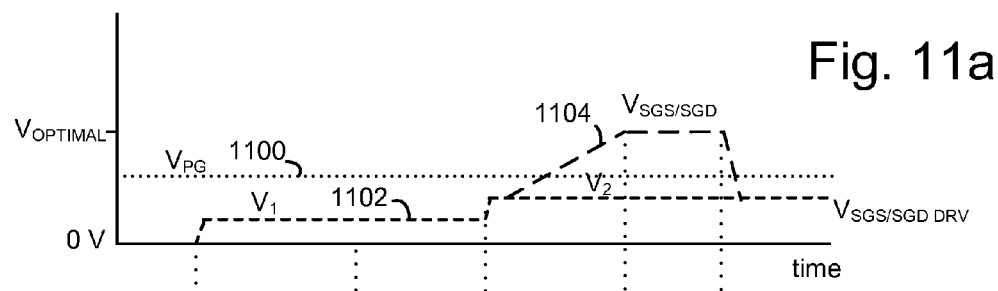
FIG. 11a depicts select gate and control voltages vs. time during a third erase operation.
Figure 11B:
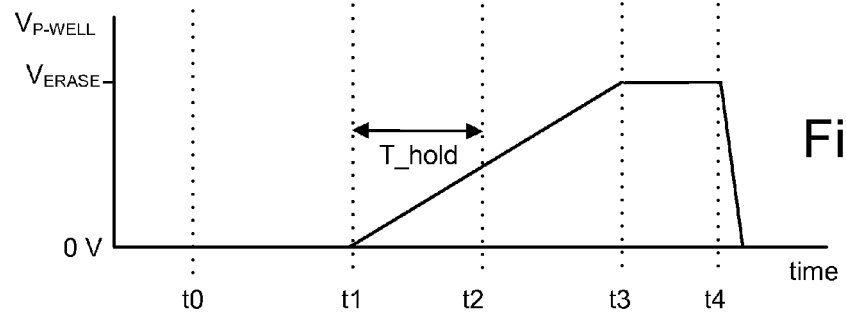
FIG. 11b depicts a p-well voltage vs. time during the third erase operation.

FIG. 11a depicts select gate and control voltages vs. time during a third erase operation. This approach allows $V_{SGS/SGD}$ to be set at a lower final level by delaying the time at which $V_{SGS/SGD}$ is allowed to float. Specifically, at a start of the erase operation, between t0 and t1, $V_{SGS/SGD}$ DRV (waveform 1102) and $V_{PG}$ (waveform 1100) are set so that the select gate pass gates are conductive, as a result of which $V_{SGS/SGD}=V_{SGS/SGD\_DRV}$. Specifically, $V_{SGS/SGD\_DRV}=V_1$, where $V_{PG}-V_1$ exceeds the threshold voltage of the pass gates. At t1, $V_{P\text{-}WELL}$ begins to ramp up, as depicted in FIG. 11b. FIG. 11b depicts a p-well voltage vs. time during the third erase operation. However, $V_{SGS/SGD}$ continues to be driven at $V_1$ for an additional period of T_hold, e.g., t2–t1, to delay the onset of floating. At t2, $V_{SGS/SGD}$ is floated (curve 1104) by raising $V_{SGS/SGD\_DRV}$ to $V_2$, where $V_{PG}-V_2$ does not exceed the threshold voltage of the pass gates, thus cutting off the associated pass gates. At t3, $V_{P\text{-}WELL}$ reaches its final level, $V_{ERASE}$, and is held there until t4. Also between t3 and t4, $V_{SGS/SGD}$ continues to float at a final level such as $V_{OPTIMAL}$. By changing $V_2$ and T_hold, the final level of $V_{SGS/SGD}$ can be optimized (at $V_{OPTIMAL}$). This approach allows $V_{SGS/SGD}$ to be controlled within a very wide range, from a minimum of 0 V.

Note that implementing the delay T_hold avoids the need for a detection mechanism which triggers floating of the select gates when $V_{P\text{-}WELL}$ is detected to reach a specified level. However, it is possible alternatively to use such a detection mechanism to trigger floating of the select gates.

As mentioned, the select gates can be floated by cutting off the pass gates 816 and 828, respectively, by raising $V_{SGS/SGD\_DRV}$ from $V_1$ to $V_2$, so that the difference between $V_{SGS/SGD\_DRV}$ and $V_2$ is less than the threshold voltage of the respective pass gate. That is, the pass gate 816, for instance, will pass $V_{SGD\_DRV}$ to the line 818 if $V_{PG} > V_{SGD\_DRV} + V_{TH}$ (PG). The pass gate will be cutoff so that $V_{SGD\_DRV}$ is not passed to the line 818 if either $V_{SGD\_DRV}$ is raised sufficiently high, or $V_{PG}$ is lowered sufficiently. Raising $V_{SGS/SGD\_DRV}$ only cuts off the pass gates for the select gates, and not for the word lines. Although lowering $V_{PG}$ is feasible, lowering it to a very low value such as 0 V can cut off the pass gates for all word lines so that they cannot be driven at 0 V or another low voltage, e.g., 1 V.

Figure 11C:
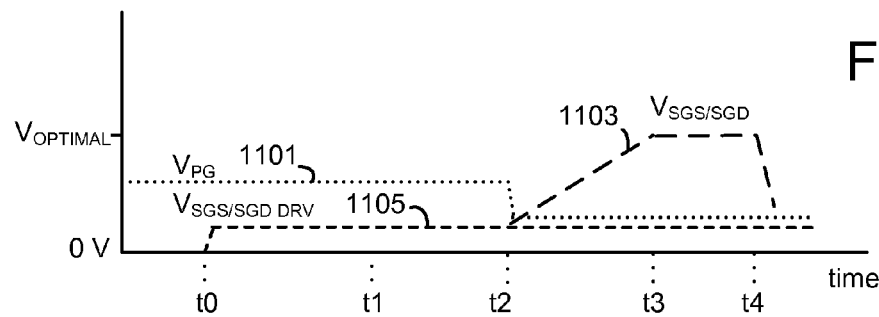
FIG. 11c depicts an alternative to the third erase operation.

Thus, in another possible approach, depicted in FIG. 11c, $V_{PG}$ (waveform 1101) can be lowered to an intermediate, non-zero level at t2, which is low enough to cut off the select gate pass gates but not the word line pass gates. For example, assume we want to drive all word lines at 1 V and we want to drive the select gates at $V_{SGS/SGD\_DRV}=2$ V and then float them. Then, we can start with $V_{PG}=V_{TH}(PG)+2.1$ V from t0–t2. This means that all word lines can still be driven at 1 V since all word line pass gates will be conductive. At this time, even the select gate pass gates are conductive. At t2–t4, when we want to float the select gates, we pull down $V_{PG}$ to 2 V, which causes the pass gate select gates to become non-conductive. However, all word line pass gates are still conductive. Thus, from t0–t2, $V_{PG}$ is sufficiently high to keep all pass gates conductive, but from t2–t4 it is only sufficiently high to keep the word line pass gates conductive. $V_{SGS/SGD\_DRV}$ (waveform 1105) and $V_{SGS/SGS}$ (waveform 1103) are also depicted. Once the pass gate is fully cutoff, $V_{SGD}$ will increase by floating in correspondence with $V_{P-WELL}$ (curve 1104), between t2 and t3.

Figure 12A:
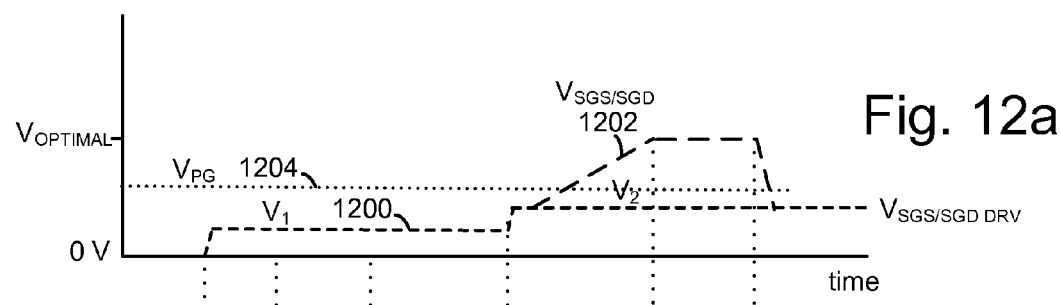
FIG. 12a depicts select gate and control voltages vs. time during a fourth erase operation.
Figure 12B:
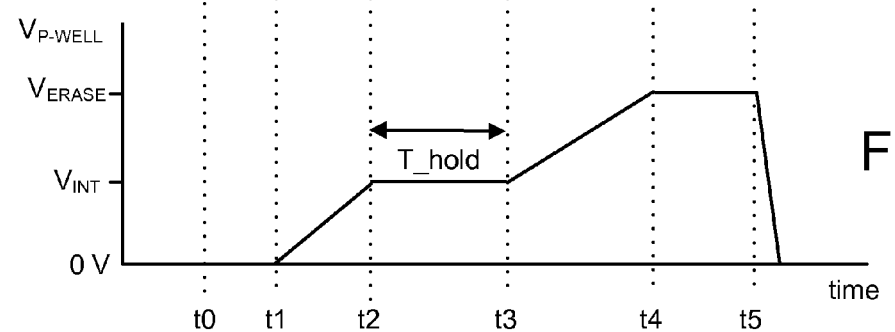
FIG. 12b depicts a p-well voltage vs. time during the fourth erase operation.

FIG. 12a depicts select gate and control voltages vs. time during a fourth erase operation. FIG. 12b depicts a p-well voltage vs. time during the fourth erase operation. In this approach, the shape of the erase waveform is modified to include two tiers or steps, one at an intermediate level of $V_{INT}$, and one at the final level of $V_{ERASE}$. This approach also allows $V_{SGS/SGD}$ to be controlled to lower values. $V_{INT}$ and $V_{ERASE}$ can be separately optimized to achieve an appropriate level for $V_{SGS/SGD}$. Specifically, at a start of the erase operation, at t0, $V_{SGS/SGD}$ is raised to an initial level $V_1$ (waveform 1200). At t1, $V_{P-WELL}$ begins to ramp up to $V_{INT}$. Between t1–t2, $V_{SGS/SGD}$ continues to be driven at $V_1$ for a period of T_hold to delay the onset of floating. At t3, $V_{P-WELL}$ begins to ramp up again, from $V_{INT}$ to $V_{ERASE}$. Also, starting at t3, $V_{SGS/SGD}$ is floated in concert with the ramping (waveform 1202), by raising $V_{SGS/SGD}$ from $V_1$ to $V_2$ to cutoff the respective pass gates, and/or lowering $V_{PG}$, as described previously. At t4, $V_{P-WELL}$ reaches its final level, and is held there until t5. Also between t4 and t5, $V_{SGS/SGD}$ continues to float at a final level such as $V_{OPTIMAL}$.

In this case, the final level of $V_{SGS/SGD}$ does not require precise control of timing, as depicted in FIGS. 11a and 11b. Further, most of the coupling is due to the magnitude of $V_{ERASE} - V_{INT}$. So, we can control the final level by setting $V_{INT}$ appropriately.

FIG. 13 depicts an erase process which corresponds to FIGS. 9a and 9b. At step 1300, an erase operation begins. At step 1302, the select gate voltages are driven at an initial level, $V_{INITIAL}$. At step 1304, the select gate pass gates are cutoff and the p-well voltage is ramped up, causing the select gate voltages to float up with the p-well voltage. At step 1306, the p-well voltage is driven at a maximum level, $V_{ERASE}$, while continuing to allow the select gate voltages to float. At step 1308, the p-well voltage is lowered and the process is completed. Note that the processes of FIGS. 13-16 may be repeated in multiple iterations, as discussed in connection with FIG. 3b, while performing a verify operation after each iteration, in one possible approach.

FIG. 14 depicts an erase process which corresponds to FIGS. 10a and 10b. At step 1400, an erase operation begins. At step 1402, the select gate voltages are driven at an initial level, $V_{INITIAL}$. At step 1404, the p-well voltage is ramped up while also driving the select gate voltages in correspondence with the p-well voltage. At step 1406, the p-well voltage is driven at a maximum level, $V_{ERASE}$, while continuing to drive the select gate voltages at their final level. At step 1408, the p-well voltage is lowered and the process is completed.

FIG. 15 depicts an erase process which corresponds to FIGS. 11a and 11b. At step 1500, an erase operation begins. At step 1502, the select gate voltages are driven at an initial level, $V_{INITIAL}$. At step 1504, the p-well voltage is ramped up while continuing to drive the select gate voltages at the initial level for a period of T_hold. At step 1506, the select gate pass gates are cutoff and the p-well voltage continues to ramp up, causing the select gate voltages to float up with the p-well voltage. At step 1508, the p-well voltage is driven at the final level while the floating of the select gate voltages continues. At step 1510, the p-well voltage is lowered and the process is completed.

FIG. 16 depicts an erase process which corresponds to FIGS. 12a and 12b. At step 1600, an erase operation begins. At step 1602, the select gate voltages are driven at an initial level, $V_{INITIAL}$. At step 1604, the p-well voltage is ramped up to a first level, $V_1$, while continuing to drive the select gate voltages at the initial level. At step 1606, the p-well voltage is driven at the first level and the select gate continues to be driven at their initial level for a period of T_hold. At 1608, the select gate pass gates are cutoff and the p-well voltage is ramped up from the first level to a final, second level, causing the select gate voltages to float up with the p-well voltage. At step 1610, the p-well voltage is driven at the final level while floating of the select gate voltages continues. At step 1612, the p-well voltage is lowered and the process is completed.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for erasing at least one set of series-connected non-volatile storage elements formed on a substrate, the method comprising:

in a first time period, driving at least one select gate of the at least one set of series-connected non-volatile storage elements at a non-zero level;

in a second time period which follows the first time period, ramping up an erase voltage which is applied to the substrate while continuing to drive the at least one select gate at the non-zero level;

in a third time period which follows the second time period, continuing to ramp up the erase voltage, until the erase voltage reaches a final erase voltage level, while floating a voltage of a control gate of the at least one select gate; and in a fourth time period which follows the third time period, driving the erase voltage at the final erase voltage level while continuing to float the voltage of the control gate of the at least one select gate.

2. The method of claim 1, wherein:
the driving of the at least one select gate in the first and second time periods comprises connecting a voltage source to the control gate of the at least one select gate via a pass gate; and
the floating of the voltage of the control gate of the at least one select gate in the third and fourth time periods comprises cutting off the pass gate.

3. The method of claim 1, wherein:
the erase voltage is ramped up starting from 0 V in the second time period.

4. The method of claim 1, wherein:
the non-zero level is selected to achieved a desired maximum level of the voltage of the control gate when the voltage of the control gate is floated.

5. The method of claim 1, wherein:
the driving the at least one select gate at the non-zero level in the first time period, and the continuing to drive the at least one select gate at the non-zero level in the second time period, comprise driving at least one of a source side select gate and a drain side select gate of the at least one set of series-connected non-volatile storage elements.

6. The method of claim 2 wherein:
the cutting off the pass gate comprises
lowering a voltage applied to a control gate of the pass gate at a start of the third time period.

7. The method of claim 1, wherein:
the second time period directly follows the first time period, the third time period directly follows the second time period, and the fourth time period directly follows the third time period.

8. A method for erasing at least one set of series-connected non-volatile storage elements formed on a substrate, the method comprising:
in a first time period, ramping up an erase voltage which is applied to the substrate from an initial level to a first level;
in a second time period which follows the first time period, driving the erase voltage at the first level;

driving at least one select gate of the at least one set of series-connected non-volatile storage elements during the first and second time periods;
in a third time period which follows the second time period, ramping up the erase voltage further to a second level, while floating a voltage of a control gate of the at least one select gate; and
in a fourth time period which follows the third time period, driving the erase voltage at the second level, while continuing to float the voltage of the control gate of the at least one select gate.

9. The method of claim 8, wherein:
during the first and second time periods, the at least one select gate is driven at a constant first, non-zero level.

10. The method of claim 8, wherein:
the second time period directly follows the first time period, the third time period directly follows the second time period, and the fourth time period directly follows the third time period.

11. The method of claim 8, wherein:
the initial level of the erase voltage is 0 V.

12. An apparatus which performs the method of claim 1.

13. An apparatus which performs the method of claim 8.

14. The method of claim 1, wherein:
in the third time period, the voltage of the control gate of the at least one select gate floats up as the erase voltage ramps up.

15. The method of claim 1, wherein:
in the fourth time period, the voltage of the control gate of the at least one select gate floats at a final, non-zero level as the erase voltage is driven at the final erase voltage level.

16. The method of claim 8, wherein:
in the third time period, the voltage of the control gate of the at least one select gate floats up as the erase voltage ramps up.

17. The method of claim 8, wherein:
in the fourth time period, the voltage of the control gate of the at least one select gate floats at a final, non-zero level as the erase voltage is driven at the second level.

* * * * *